United States Patent
Roell et al.

(10) Patent No.: US 6,717,407 B2
(45) Date of Patent: Apr. 6, 2004

(54) METHOD FOR EVALUATING MAGNETIC RESONANCE DATA CONTAINING SPECTROSCOPIC INFORMATION, BY ANALYSIS OF A FREQUENCY DIFFERENCE BETWEEN SPECTRUM SPIKES

(75) Inventors: Stefan Roell, Kleinseebach (DE); Elisabeth Weiland, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 24 days.

(21) Appl. No.: 10/123,743

(22) Filed: Apr. 16, 2002

(65) Prior Publication Data

US 2002/0155621 A1 Oct. 24, 2002

(30) Foreign Application Priority Data

Apr. 20, 2001 (DE) .......................................... 101 19 455

(51) Int. Cl.⁷ .................................................. G01V 3/00
(52) U.S. Cl. ........................................ 324/312; 324/309
(58) Field of Search .............................. 324/309, 307, 324/370, 312, 311

(56) References Cited

U.S. PATENT DOCUMENTS

| | | | | | |
|---|---|---|---|---|---|
| 4,719,582 A | * | 1/1988 | Ishida et al. | ................ | 702/27 |
| 4,847,559 A | * | 7/1989 | Keren | ................ | 324/307 |
| 5,218,299 A | * | 6/1993 | Dunkel | ................ | 324/307 |
| 5,572,125 A | * | 11/1996 | Dunkel | ................ | 324/307 |
| 5,698,401 A | * | 12/1997 | Fesik et al. | ................ | 435/7.1 |

FOREIGN PATENT DOCUMENTS

DE 198 49 231 8/2000

OTHER PUBLICATIONS

"Automated Spectral Analysis II: Application of Wavelet Shrinkage for Characterization of Non–Parameterized Signals," Young et al., Magnetic Resonance in Medicine, vol. 40 (1998) pp. 816–821.

"Ein–und zweidimensionale NMR–Spektroskopiie," Friebolin (1992), pp. 20–24, 30 and 154–156.

"On–line Rechner in der Chemie," Ziessow (1973), pp. 188–191 and 300–303.

* cited by examiner

Primary Examiner—Diego Gutierrez
Assistant Examiner—Dixomara Vargas
(74) Attorney, Agent, or Firm—Schiff Hardin LLP

(57) ABSTRACT

In a method for evaluating data that are generated by a magnetic resonance technique and contain spectroscopic information, at least two spikes of a spectrum of the data are detected, position that the detected spikes exhibit relative to one another within the spectrum is compared to spikes of known substances; and a known substance is allocated to the detected spikes given a coincidence of the comparison.

13 Claims, 1 Drawing Sheet

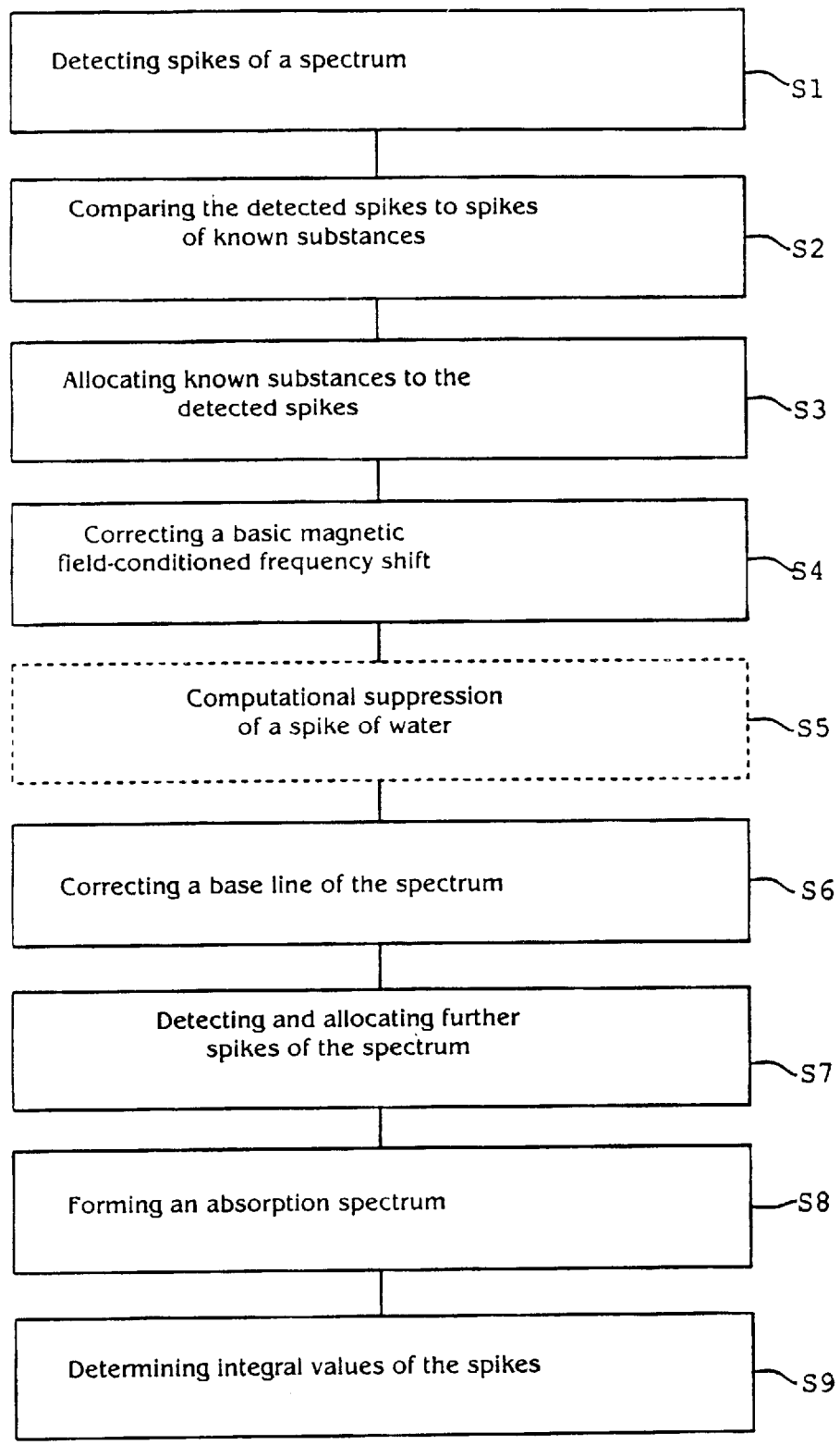
FIG

METHOD FOR EVALUATING MAGNETIC RESONANCE DATA CONTAINING SPECTROSCOPIC INFORMATION, BY ANALYSIS OF A FREQUENCY DIFFERENCE BETWEEN SPECTRUM SPIKES

BACKGROUND OF THE INVENTION

1. Field of the Invention

The present invention is directed to a method for evaluating data that are generated with magnetic resonance technology and contain spectroscopic information.

2. Description of the Prior Art

Magnetic resonance spectroscopy has been utilized for more than four decades in physical, chemical and biochemical basic research, for example as an analysis technique or for structural identification of complex molecules. Magnetic resonance spectroscopy, just like magnetic resonance tomography is based on the principle of nuclear magnetic resonance. The primary objective of spectroscopy, however, is not imaging but an analysis of a substance. Resonant frequencies of isotopes that have a magnetic moment, for example $^1H$, $^{13}C$ or $^{31}P$, are dependent on a chemical structure of molecules wherein said isotopes are bonded. A determination of the resonant frequencies therefore allows a differentiation to be made between various substances. The signal intensity at the various resonant frequencies provides information about a concentration of the corresponding molecules.

When a molecule is introduced into a basic magnetic field of a magnetic resonance apparatus, as occurs in spectroscopy, electrons of the molecule shield the basic magnetic field for atomic nuclei of the molecule. As a result of this effect, the local magnetic field changes at the location of an atomic nucleus by a few millionths of the external basic magnetic field. The variation of the resonant frequency of this atomic nucleus associated therewith is referred to as chemical shift. Molecules can thus be identified on the basis of their chemical shift. Since frequency differences can be more simply and exactly acquired by measurement than absolute frequencies, the chemical shift is indicated relative to a reference signal, for example the operating frequency of the magnetic resonance apparatus, being indicated in PPM.

A resonance line of an atomic nucleus can be split into a number of lines when further atomic nuclei having a magnetic moment are located in the environment of the atomic nucleus being observed. This is due to a the spin—spin coupling between the atomic nuclei. The magnetic flux density of the basic magnetic field that an atomic nucleus experiences is thus not only dependent on the electron sheath around this atomic nucleus but also is dependent on the orientation of the magnetic fields of the neighboring atoms.

Clinical magnetic resonance spectroscopy using a clinical magnetic resonance spectroscopy upon employment of clinical magnetic resonance apparatus. The methods of localized magnetic resonance spectroscopy differ from those of magnetic resonance imaging essentially by the chemical shift also being resolved by spectroscopy in addition to the tomographic topical resolution. Currently, two localization methods of magnetic resonance spectroscopy dominate in the clinical application. These are single-volume techniques based on echo methods wherein a spectrum of a previously selected target volume is registered. Also, there are spectroscopic imaging methods, referred to as CSI (Chemical Shift Imaging) methods that simultaneously enable the registration of spectra of many spatially interconnected target volumes.

Spectroscopy examination methods are employed in clinical phosphorous spectroscopy as well as in proton spectroscopy. A three dimensional CSI method includes, for example, the following steps. After a non-slice-selected 90° RF pulse, a combination of magnetic phase coding gradients in the three spatial directions is activated for a defined time and the magnetic resonance signal is subsequently read out in the absence of gradients. This is repeated with other combinations of phase coding gradients until the desired topical resolution has been achieved. A four-dimensional Fourier transformation of the magnetic resonance signals supplies the desired spatial distribution of the resonance lines. A two-dimensional CSI method is similar to the three-dimensional set forth above but the said non-slice-selected RL pulse is replaced by a slice-selective excitation composed of slice-selected RF pulse and corresponding magnetic gradient, and a phase coding direction gradient is eliminated.

The single-volume techniques that are usually applied are based on an acquisition of a stimulated echo or of a secondary spin echo. In both instances, a topical resolution ensues by means of successive, selective excitations of three orthogonal slices. A target volume is defined by a section volume of the aforementioned three slices. Only the dipoles of the target volume experience all three selected RF pulses and thus contribute to the stimulated echo or secondary spin echo. The spectrum of the target volume is obtained by one-dimensional Fourier transformation of a time signal corresponding to the stimulated echo or to the secondary spin echo.

In clinical proton spectroscopy, the intense water signals are often suppressed. A known method for water suppression is, for example, the CHESS technique wherein the nuclear spins of the water molecules are first selectively excited with narrow-band 90° RF pulses and their cross-magnetization is subsequently dephased by activating magnetic field gradients. In the ideal case, no detectable magnetization of the water molecules is then available for a spectroscopy method that follows immediately thereupon.

For a prescribable volume to be investigated, for example, a magnetic resonance signal is generated with one of the methods described above, this being registered in the time domain and being converted by a Fourier transformation into an appertaining spectrum, whereby, for example, a real tart or an amount of the spectrum is represented. The spectrum is characterized by resonance lines that are also referred to as spikes. These resonance lines or spikes usually appear in the form of narrow, bell-shaped curves. Each of the resonant lines or spikes can thereby have a maximum amplitude value allocated to it, this in turn defining an appertaining frequency value of the resonance line that is characteristic of the resonance line, and thus of a very specific magnetic resonance signal-generating substance contained in the volume. Further, an integral value for one of the resonance lines or spikes in an absorption spectrum provides information about which concentration the appertaining substance has in the volume under examination. Further, what is referred to as a half-width value can be allocated to each of the resonance line or spikes. The half-width value of a resonance line is the width in the direction of the frequency axis that the resonance line has at half its maximum amplitude value.

The ultimate goal of an evaluation of a spectrum is to identify substances contained in the volume under examination on the basis of the resonance lines and to identify their concentration within the volume. The aforementioned information should be acquired insofar as possible in a fully automatic evaluation method and should be made available to an observer of the spectrum, for example a diagnostic physician, for further interpretation. The evaluation of, in particular, clinical in vivo magnetic resonance spectra has to goal of freeing the spectrum or the time signal thereof of diverse artifacts such as frequency shifts, phase shifts and baseline distortions. Following thereafter for identification and quantification of the substances contained in the volume under examination, a fitting of theoretical curves to the spectrum or to the appertaining time signal thereof is undertaken.

There are various evaluation methods available wherein, however, specific typical spectral properties are assumed to exist dependent on different volumes to be examined, for example different anatomical regions, and/or start parameters of the evaluation method prescribed by the operator. For example, the article by K. Young et al, "Automated Spectral Analysis II: Application of Wavelet Shrinkage for Characterization of Non-Parameterized Signals", Magnetic Resonance in Medicine 40 (1998), pages 816–821, describes an evaluation method wherein a parametric model for spectral components of interest is combined with a non-parametric description of unknown spectral components. The evaluation thereby has access, given a volume of a brain to be examined, to spikes of metabolites that are generally conspicuous in spectra of brains in combination with assumed, relative concentrations of the metabolites.

When the aforementioned evaluation methods are confronted, for example, with spectra that are atypical with respect to the substances generating the conspicuous spikes, then the evaluation leads to completely incorrect results or to an abort without a result. This particularly occurs in clinical magnetic resonance spectroscopy given spectra of anatomical regions that contain pathological tissue because the substances contained in the pathological tissue vary greatly from case to case.

SUMMARY OF THE INVENTION

An object of the present invention is therefore to provide an improved method for evaluating data that are generated with a magnetic resonance technique and contain spectrographic information, which among other things, is able to supply a dependable result independently of the most divergent volumes to be examined.

This object is achieved in accordance with the invention in a method for evaluating data that are generated by means of a magnetic resonance technique and that contain spectroscopic information wherein at least two spikes of a spectrum of the data are detected, the positions that the detected spikes exhibit relative to one another within the spectrum are compared to spikes of known substances, and known substances are allocated to the detected spikes given a coincidence of the comparison.

Because the invention foregoes any and all assumptions with respect to substances and their properties contained in a volume under examination, the method also functions given an absence of substances that are normally present and/or given the presence of substances not normally expected within the volume under consideration, error-free and not aborting. The method is based on recognition that the relative position of at least two spikes detected in the spectrum relative to one another—despite the initially described artifacts—allows a reliable allocation of known substances to the detected spikes by means of a comparison to spikes of known substances. Proceeding therefrom, further properties of the spikes that have already been detected and allocated and start parameters for further methods for the detection, allocation and analysis of further spikes can be acquired, so that the individual evaluation steps can sequence quasi-universally and fully automatically and lead to dependable results. The method, among other things, can be applied in a clinical routine. The medical interpretation is simplified and misjudgments due to incorrect spectral interpretations are avoided. Moreover, the spectrum is discarded if an impossible detection of at least two spikes occur and/or an impossible allocation is indicated. When evaluating CSI data, further, cross-information from neighboring voxels can also enter into the method.

DESCRIPTION OF THE DRAWINGS

The single FIGURE is a flowchart illustrating the basic steps of the inventive method.

DESCRIPTION OF THE PREFERRED EMBODIMENTS

The FIGURE shows a flowchart for a method for evaluating data that are generated by means of magnetic resonance technique and contain spectroscopic information. In a first step S1, for detecting at least two spikes of a spectrum to be analyzed that is not pre-processed, a window function that, for example, is rectangular is shifted step-by-step across the spectrum along a frequency axis of the spectrum. Averages are thereby formed per displacement step for the amplitude values of the spectrum that respectively fall within the window region. Amplitude values of the spectrum that exceed the aforementioned averages by a prescribable value are detected and allocated to regions that extend around possible spikes of the spectrum. Within one of these regions, a maximum amplitude value is detected in combination with the frequency value to it, being detected as characteristics of one of the spikes of the spectrum.

As parameters, the procedure for detecting spikes of the spectrum contains only the prescribable value and a window width. The prescribable value and the window width can be automatically set. These prescribable value is set such that the spikes have a high probability of not arising due to noise, i.e. the spikes are not detected in regions of the spectrum that have a small variance within the spectrum. So that the procedure is independent of different shapes of spikes, a region of window widths is applied. A lower limit value is of significance for the window width. Advantageously, the lower limit value is selected as twice a maximum half-width value of the expected spikes. When, for example, fewer than three spikes are detected therewith, the above procedure is repeated with a lower limit value.

The spikes detected according to the above procedure do not necessarily cover all spikes of the spectrum; however, they cover the dominant spikes. The spikes detected in this way are determined with respect to the expected, dominant spikes without any and all previously established assumptions. Even given an absence of substances that are normally contained in a specific volume to be examined, the above-described method operates error-free.

After the detection of spikes according to Step S1, a comparison of the position that the detected spikes exhibit relative to one another within the spectrum is made to spikes of known substances. The detected spikes with the relative position are thereby shifted along the frequency axis and the overlap thereof with spikes of known substances is interpreted for every displacement. The resonant frequency values of known substances are stored in a data bank. The shift that produces a maximum in terms of overlap and number of spikes between detected spikes and spikes of known substances is thereby determined.

For example, those resonant frequency values of known substances are stored in the data bank that normally occur at ambient conditions of in vivo spectroscopy. Excluded therefrom, for example are substances whose frequency values exhibit a pronounced temperature dependency, this being particularly true of water. Further, other properties of the known substances such as $T_2$ times and/or $T_2^*$ times are stored in the data bank. It usually suffices for the data bank to contain the most important substances according to the known literature dependent on different examination objects or on different regions of an object to be examined. As warranted, the content of the data bank can be suitably adapted dependent on anatomical regions to be examined.

The procedure according to Step S2 is thereby based on the recognition that a difference between the frequency values of two detected spikes is characteristic of the substance that elicited the two detected spikes, and that the substance can be identified by a comparison of this difference to differences between resonant frequency values of known substances.

In a Step S3 of the flowchart following Step S2, an allocation of a known substance ensues to the detected spikes according to that shift of the Step S2 that produces the maximum in terms of overlap and number of spikes.

If the frequency values of the detected and allocated spikes deviate from appertaining resonant frequency values of the data bank, the frequency axis of the spectrum is re-scaled in a further Step S4 with respect to the resonant frequency values known from the data bank, and thus a frequency shift of the spectrum that is caused by the basic magnetic field is corrected.

When a spike deriving from water has been detected in the third step S3, then a computational water suppression can be implemented in a further step S5. In addition to the properties already determined for the water spike such as appertaining frequency value and amplitude value, further properties such as the width of the spike are thereby identified from the spectrum and employed in the computational removal of the water spike. The water suppression can thereby be fundamentally implemented in the time domain or frequency domain.

A baseline correction of the spectrum is implemented in a further step S6. The spikes that have been previously detected and allocated are taken into consideration, for example by excluding the frequency ranges from the previously detected spikes from a determination of the baseline. The baseline correction can also again be fundamentally implemented in the time domain or frequency domain.

In a further Step S7, further spikes within the spectrum are, for example, detected and allocated by means of a complex fit method in addition to the previously detected and allocated spikes. The already-known properties such as line widths and phases of the previously detected and allocated spikes are utilized as start parameter for the complex fit method. The complex fit method can be implemented in the time domain or frequency domain with these start parameters.

With the conclusion of the complex fit method according to step S7, information about the phases of all detected spikes is present, among other things, so that the spectrum in the frequency domain is transformed into an absorption spectrum with this information in a further step S8 for the purpose of a phase correction.

In a further Step S9, an integral value for each detected and allocated spike is determined on the basis of the absorption spectrum. The integral value of one of the spikes is used as a criterion for the relative concentration of the appertaining substance within the examined volume.

In another embodiment, the comparison is implemented, for example, using of a cross-correlation method instead of the shift described in Step S2.

Although modifications and changes may be suggested by those skilled in the art, it is in the intention of the inventors to embody within the patent warranted hereon all changes and modifications as reasonably and properly come within the scope of their contribution to the art.

We claim as our invention:

1. A method for evaluating magnetic resonance data containing spectroscopic information, comprising the steps of:
   detecting at least two spikes in a spectrum of data from an unknown substance generated by a magnetic resonance technique and containing spectroscopic information, the detected spikes having respective positions in said spectrum representing a frequency difference between said at least two spikes;
   comparing the respective positions that the detected spikes exhibit relative to each other within said spectrum to spikes of at least one known substance; and
   identifying said unknown substance by allocating said at least one known substance to said detected spikes if said comparison indicates a coincidence.

2. A method as claimed in claim 1 wherein the step of detecting at least two spikes comprises detecting only at least two spikes among dominant spikes in said spectrum.

3. A method as claimed in claim 1 wherein the step of comparing the respective positions of the detected spikes comprises shifting the detected spikes while maintaining said relative position therebetween through a plurality of shifts along a frequency axis of said spectrum relative to respective spikes of a plurality of known substances.

4. A method as claimed in claim 3 wherein the step of allocating said at least one known substance to said detected spikes comprises allocating at least one known substance to said detected spikes associated with one of said shifts which produces a maximum with regard to overlap and number of spikes between said detected spikes and the respective spikes of said at least one known substance.

5. A method as claimed in claim 1 comprising making a basic magnetic field-dependent frequency shift of said spectrum upon identification of a difference between a frequency value of one of said detected spikes and a resonant frequency of said at least one known substance allocated to said detected spikes.

6. A method as claimed in claim 1 comprising the additional step of, if water is said at least one known substance allocated to said detected spikes, computationally removing any water spikes from said spectrum.

7. A method as claimed in claim 1 wherein said spectrum has a base line associated therewith, and comprising the additional step of implementing a correction of said base line.

8. A method as claimed in claim 7 comprising implementing said correction of said base line only in regions of said spectrum that are free of said detected spikes.

9. A method as claimed in claim 1 wherein the detected spikes to which said at least one known substance is allocated have properties associated therewith, and comprising the additional step of employing said properties as start parameters in a subsequent procedure for detecting further spikes and allocating at least one known substance to the detected further spikes.

10. A method as claimed in claim 1 wherein the detected spikes to which said at least one known substance is allocated have phase values associated therewith, and comprising the additional step of forming an absorption spectrum for said data based on said phase values.

11. A method as claimed in claim 1 comprising calculating an integral value for at least one of the detected spikes to which said at least one known substance is allocated.

12. A method as claimed in claim 1 comprising storing properties of said at least one known substance in a data bank.

13. A method as claimed in claim 12 comprising selecting said properties from the group consisting of resonant frequency values, $T_2$ times and $T^*_2$.

* * * * *